United States Patent
Kuroda et al.

(10) Patent No.: US 10,014,604 B2
(45) Date of Patent: Jul. 3, 2018

(54) SPRING CONTACT AND SOCKET INCLUDING SPRING CONTACT

(71) Applicant: ALPS ELECTRIC CO., LTD., Tokyo (JP)

(72) Inventors: Yoshimasa Kuroda, Miyagi-ken (JP);
Yoshio Tanabe, Miyagi-ken (JP);
Takeki Uozumi, Miyagi-ken (JP);
Shigetomo Chiba, Miyagi-ken (JP);
Keisuke Yamazaki, Miyagi-ken (JP)

(73) Assignee: APLS ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/645,638

(22) Filed: Jul. 10, 2017

(65) Prior Publication Data

US 2018/0013217 A1    Jan. 11, 2018

(30) Foreign Application Priority Data

Jul. 11, 2016  (JP) .................... 2016-136488

(51) Int. Cl.
| H01R 13/24 | (2006.01) |
| H01R 12/58 | (2011.01) |
| H01R 13/415 | (2006.01) |
| H01R 43/16 | (2006.01) |
| G01R 1/067 | (2006.01) |

(52) U.S. Cl.
CPC ......... *H01R 12/58* (2013.01); *G01R 1/06722* (2013.01); *H01R 13/2421* (2013.01); *H01R 13/415* (2013.01); *H01R 43/16* (2013.01)

(58) Field of Classification Search
CPC .. H01R 12/58; H01R 13/2421; H01R 13/415; H01R 43/16
USPC .................................................. 439/700, 824
See application file for complete search history.

(56) References Cited

U.S. PATENT DOCUMENTS

| 5,649,840 A | * | 7/1997 | Muto ..................... H01R 24/58 439/668 |
| 7,094,112 B2 | * | 8/2006 | Arai ..................... H01R 13/187 439/482 |
| 8,210,855 B1 | * | 7/2012 | Lin ..................... H01R 13/2471 439/66 |
| 8,408,946 B1 | * | 4/2013 | Sochor ................. H01R 4/4863 324/755.01 |
| 8,710,856 B2 | * | 4/2014 | Swart ................. G01R 1/06722 324/538 |

(Continued)

FOREIGN PATENT DOCUMENTS

| JP | 2011-158454 A | 8/2011 |
| JP | 2013-167616 A | 8/2013 |

*Primary Examiner* — Khiem Nguyen
(74) *Attorney, Agent, or Firm* — Brinks Gilson & Lione

(57) ABSTRACT

An interior body is housed in a tubular exterior body. The interior body includes a spring portion, a movable portion, and a fixing portion, which are integrated together. Elastic arms are disposed on the movable portion so as to extend downward. Each elastic arm includes, at a lower end portion, an elastically pressing portion, which is elastically pressed against a tubular internal surface of the exterior body. Since the elastically pressing portion is elastically pressed against the exterior body, electric signals are more likely to flow between the movable portion and the exterior body and more likely to be prevented from leaking to the spring portion.

15 Claims, 21 Drawing Sheets

(56) References Cited

U.S. PATENT DOCUMENTS

2007/0224889 A1\* 9/2007 Ito .................. H01R 13/2421
439/824
2013/0207682 A1 8/2013 Lee

\* cited by examiner

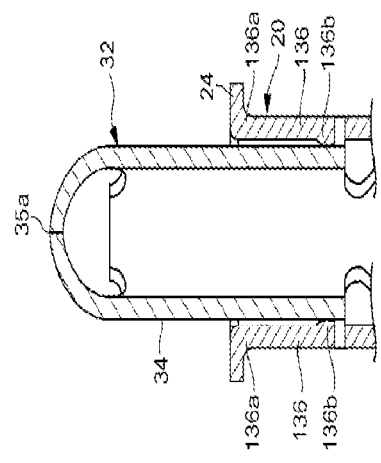
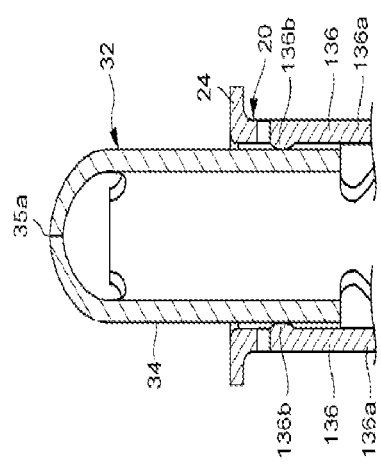
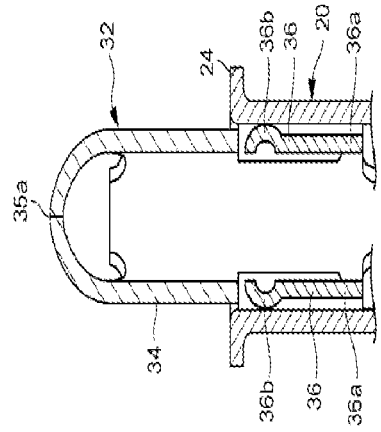

SPRING CONTACT AND SOCKET INCLUDING SPRING CONTACT

CLAIM OF PRIORITY

This application claims benefit of priority to Japanese Patent Application No. 2016-136488 filed on Jul. 11, 2016, which is hereby incorporated by reference in its entirety.

BACKGROUND

1. Field of the Disclosure

The present disclosure relates to a spring contact including a tubular exterior body, formed from an electrically conductive metal plate, and an interior body, housed in the exterior body, formed from a metal plate, and including a spring portion and a movable portion. The present invention also relates to a socket including the spring contact.

2. Description of the Related Art

Japanese Unexamined Patent Application Publication Nos. 2011-158454 and 2013-167616 provide disclosures relating to a spring contact.

A contact probe described in Japanese Unexamined Patent Application Publication No. 2011-158454 includes a tubular barrel that houses a coil spring and plungers on both sides of the coil spring. This contact probe is installed in a probe card. When multiple probe pins are interposed between a substrate and a test LSI, the coil spring contracts due to the pressure between the substrate and the test LSI, so that the plungers touch the substrate and the test LSI and conduct electricity to the substrate and the test LSI.

Japanese Unexamined Patent Application Publication No. 2013-167616 describes a spring-type probe pin formed from an elastic plate material. A method for manufacturing this probe pin includes blanking a piece out of a flat plate material and bending the piece. Thus, an upper sleeve, a lower sleeve, and a buffer operator that is to be housed in both sleeves are integrally formed. The upper sleeve and the lower sleeve are assembled together so as to be vertically movable and guidable with respect to each other while housing the buffer operator inside them.

A probe pin including a spring portion is required to have an electrical path designed so that electric signals do not flow through the spring portion.

Preventing electric signals from flowing through the coil spring in the contact probe described in Japanese Unexamined Patent Application Publication No. 2011-158454 requires effective contact between a large diameter portion of the plunger and the internal surface of the barrel. The large diameter portion of the plunger and the internal surface of the barrel, however, simply slide over each other and thus the contact between the plunger and the barrel is constantly kept unstable.

The probe pin described in Japanese Unexamined Patent Application Publication No. 2013-167616 includes the upper sleeve, the lower sleeve, and the buffer operator (coil spring) housed in both sleeves, which are formed from an integrated plate material. Unless the upper sleeve and the lower sleep are brought into reliable contact with each other, electric signals are more likely to flow through the buffer operator. The tubular internal surface of the upper sleeve and the tubular external surface of the lower sleeve simply slide over each other, so that the contact between the upper sleeve and the lower sleeve is unstable and reliable electrical conduction between the sleeves is difficult to obtain.

The present invention provides a spring contact including a tubular exterior body and a movable portion including a contact portion and having a structure in which the exterior body and the movable portion are reliably electrically connected to each other. The present invention also provides a socket including the spring contact.

SUMMARY

The present invention provides a spring contact that includes an exterior body and an interior body housed in the exterior body. The interior body includes a spring portion, a movable portion continuous with at least one side of the spring portion, and a contact portion that is part of the movable portion. The movable portion is urged by an elastic force of the spring portion in such a direction as to protrude from the exterior body. At least one elastic arm is formed integrally with the movable portion and part of the elastic arm is elastically pressed against an internal surface of the exterior body so as to be slidable over the internal surface.

The present invention also provides a spring contact that includes an exterior body and an interior body housed in the exterior body. The interior body includes a spring portion, a movable portion continuous with at least one side of the spring portion, and a contact portion that is part of the movable portion. The movable portion is urged by an elastic force of the spring portion in such a direction as to protrude from the exterior body. At least one elastic arm is formed integrally with the exterior body and part of the at least one elastic arm is elastically pressed against an external surface of the movable portion.

BRIEF DESCRIPTION OF THE DRAWINGS

FIGS. 7A, 7B, and 7C are partially enlarged sectional views of a portion at which elastic arms according to modifications are disposed;

DESCRIPTION OF THE EXEMPLARY EMBODIMENTS

Socket

Figure 1:
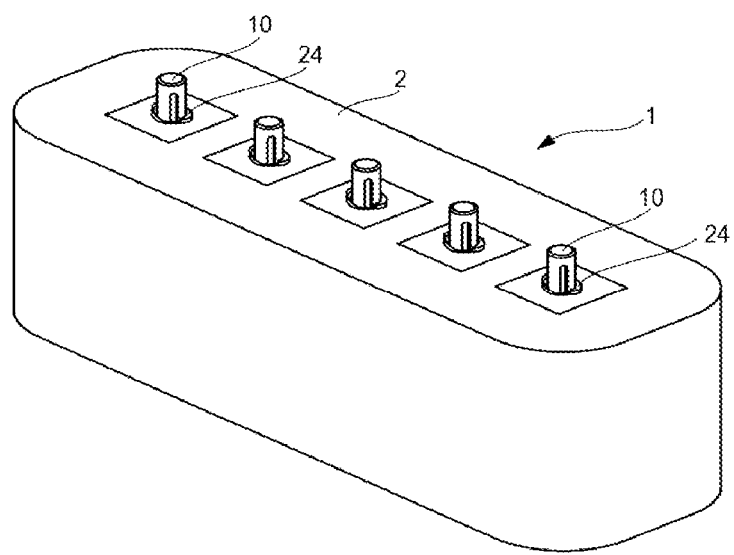
FIG. 1 is a perspective view of a socket according to an embodiment including multiple spring contacts.
Figure 2:
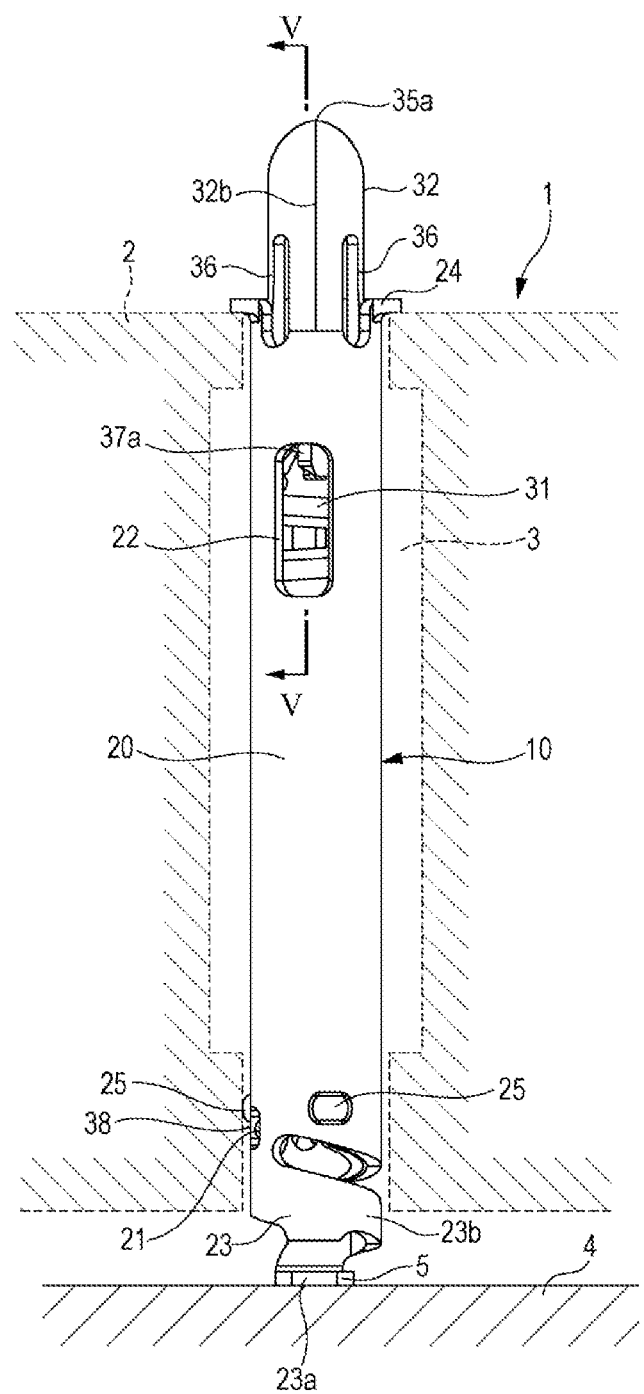
FIG. 2 is a front view of a section of the socket illustrated in FIG. 1 and the exterior of a spring contact according to a first embodiment of the present invention.

A socket 1 illustrated in FIG. 1 includes an insulating casing 2. As illustrated in FIG. 2, the casing 2 has multiple contact holding spaces 3, in each of which a spring contact 10 according to a first embodiment of the present invention is held.

As illustrated in FIG. 2, the socket 1 is placed on a printed circuit board 4. The base portion of each spring contact 10 is exposed from the bottom of the casing 2. A fixing terminal 23 disposed at the base portion of the spring contact 10 is fixed to a conductive pattern on the surface of the printed circuit board 4 with a solder joint 5.

Spring Contact 10 According to First Embodiment

FIGS. 2 to 6 illustrate the spring contact 10 according to a first embodiment of the present invention.

Figure 3A:
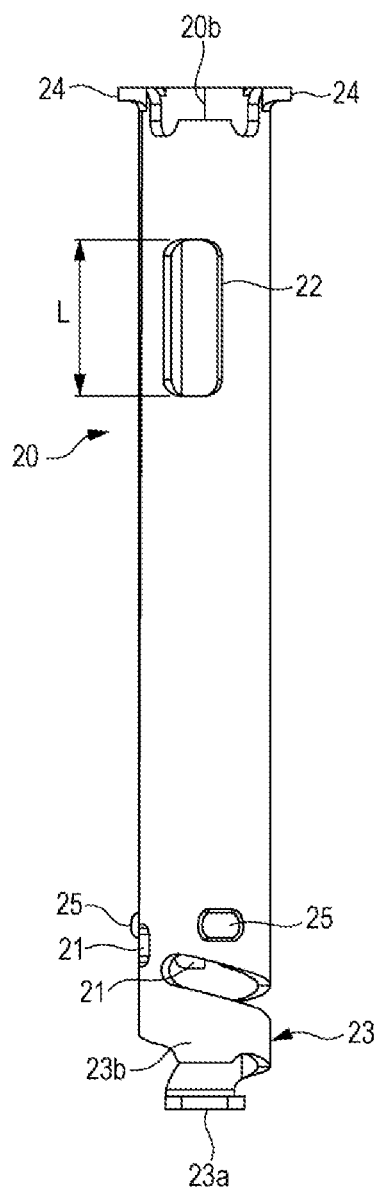
FIG. 3A is a front view of an exterior body of the spring contact illustrated in FIG. 2.
Figure 3B:
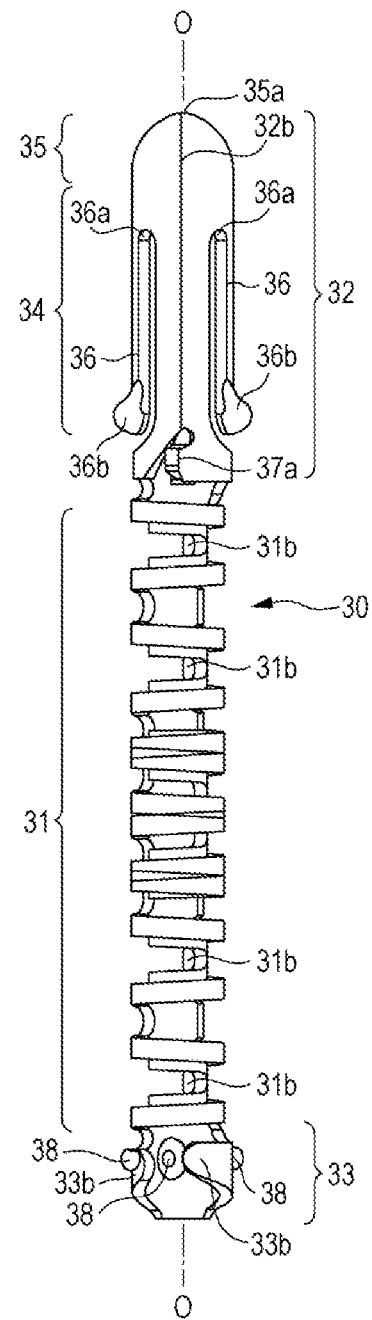
FIG. 3B is a front view of an interior body of the spring contact illustrated in FIG. 2.

The spring contact 10 includes an assembly of an exterior body 20 and an interior body 30. FIG. 3A is a front view of the exterior body 20 and FIG. 3B is a front view of the interior body 30.

Figure 10:
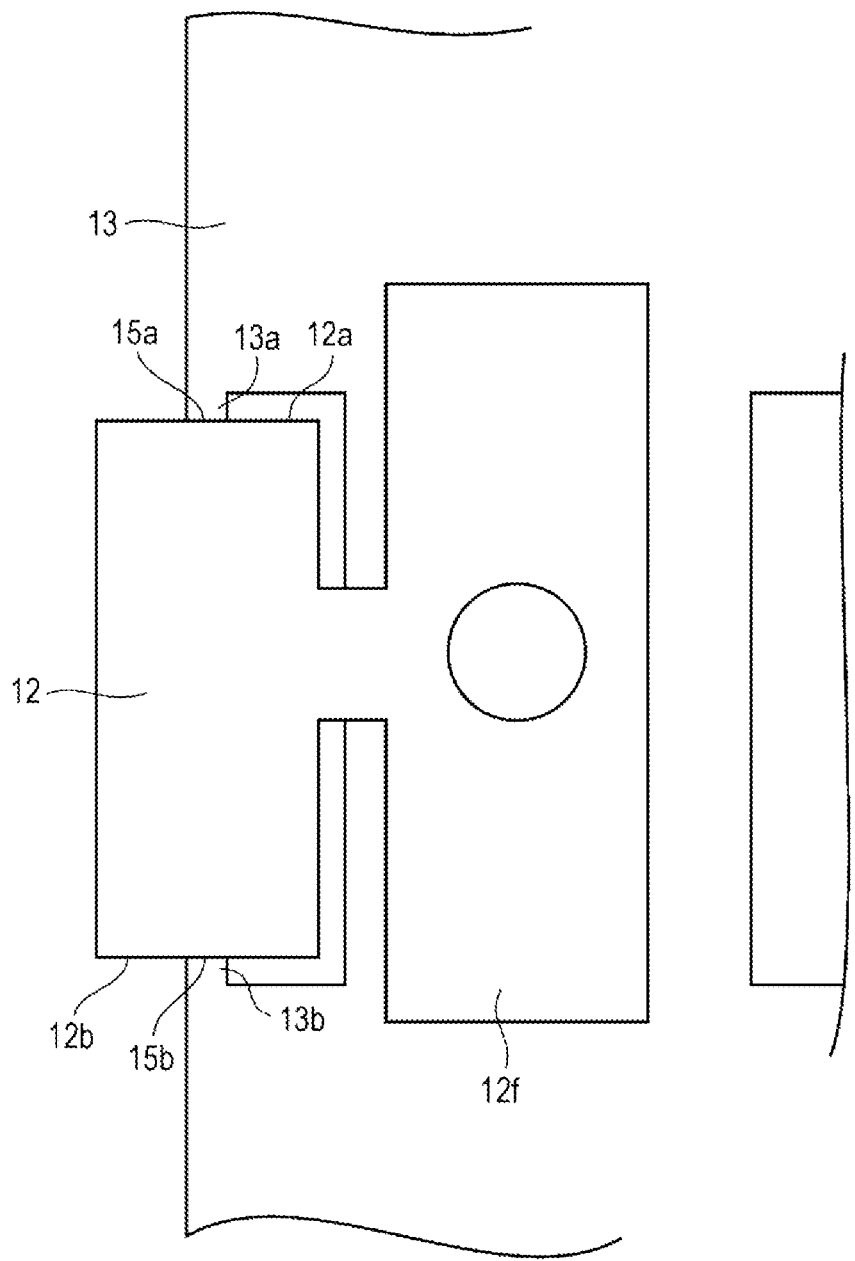
FIG. 10 illustrates a first step of a method according to a first embodiment for manufacturing the spring contact illustrated in FIG. 2.

FIG. 10 and the subsequent drawings illustrate the steps of a method for manufacturing the spring contact 10. The exterior body 20 is formed by bending a first metal plate 12 illustrated in FIG. 10 and the interior body 30 is formed by bending a second metal plate 13 illustrated in FIG. 10. Forming the exterior body 20 and the interior body 30 from different metal plates allows the exterior body 20 and the interior body 30 to be formed from metal materials appropriate for their functions.

The exterior body 20 of the spring contact 10 has a function of allowing electric signals to pass therethrough, so that a material having low electric resistance is selected as the first metal plate 12. The interior body 30 includes a spring portion 31, so that a material having a high modulus of elasticity is selected as the second metal plate 13.

For example, a material having lower electric resistance than a material from which the second metal plate 13 is formed is selected for the first metal plate 12. The electric resistance of the first metal plate 12 and the second metal plate 13 is measured per unit plate area while the first metal plate 12 and the second metal plate 13 are in the flat state as illustrated in FIG. 10. On the other hand, a material having a higher modulus of elasticity than the first metal plate 12 is selected as a material for the second metal plate 13. Here, the modulus of elasticity is a constant of proportionality of stress/strain per unit plate area obtained when the same bending force is applied to the first metal plate 12 and the second metal plate 13 over the same area.

In this embodiment, the second metal plate 13 is formed from a metal material having a higher Young's modulus than the first metal plate 12 and the first metal plate 12 is formed from a metal material having lower specific resistance than the second metal plate 13.

An example of the above combination is beryllium copper or titanium copper for the second metal plate 13 and copper with high purity, called tough pitch copper, for the first metal plate 12. A combination of the first metal plate 12 and the second metal plate 13 is selected from various metal materials. Any combination containing copper is preferable.

The first metal plate 12 and the second metal plate 13 may be formed from the same metal material as long as the electric resistance relationship and the relationship in modulus of elasticity between them can satisfy the above conditions. For example, when the spring contact 10 having extremely low electric resistance is to be formed, a material having low electric resistance, such as a copper plate, is used. Here, the second metal plate 13 is formed to have a larger plate thickness than the first metal plate 12. Thus, the second metal plate 13 can have a higher modulus of elasticity and the first metal plate 12 and the second metal plate 13 can have low electric resistance.

When the spring contact 10 having long life against repeated use regardless of whether the electric resistance is high or low is to be formed, both of the first metal plate 12 and the second metal plate 13 are formed from a material having a high Young's modulus, such as beryllium copper or titanium copper, and the first metal plate 12 is formed to have a larger plate thickness than the second metal plate 13. This configuration achieves the spring contact 10 in which the first metal plate 12 has higher electric conductivity, the interior body 30 has a spring portion having a higher elastic force, and the electric resistance is reduced to the lowest possible level.

Figure 11:
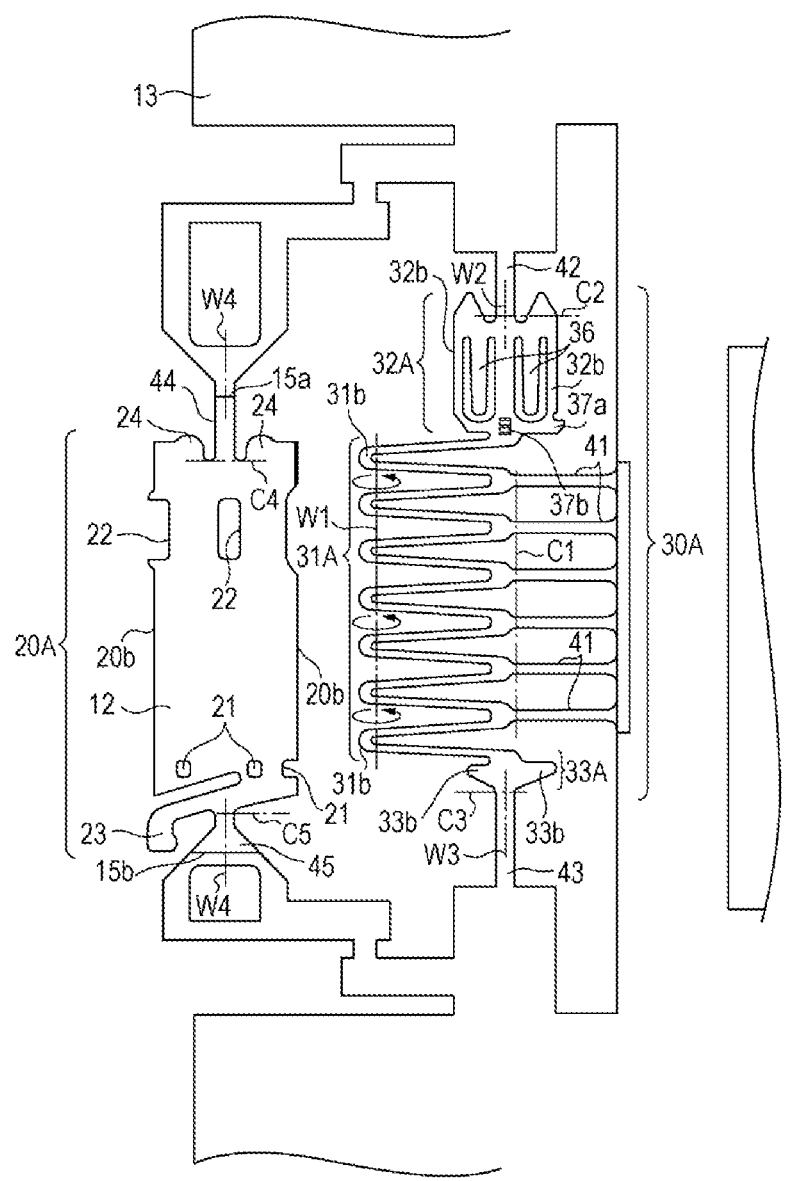
FIG. 11 illustrates a second step of the method according to the first embodiment for manufacturing the spring contact illustrated in FIG. 2.

In the manufacturing step illustrated in FIG. 10, the first metal plate 12 and the second metal plate 13 are subjected to blanking during a pressing step in the state where the first metal plate 12 and the second metal plate 13 are joined together. FIG. 11 illustrates a first developed structure 20A, blanked out from the first metal plate 12, and a second developed structure 30A, blanked out from the second metal plate 13. Bending the first developed structure 20A forms the exterior body 20 illustrated in FIG. 3A. Bending the second developed structure 30A forms the interior body 30 illustrated in FIG. 3B.

As illustrated in FIG. 3B, the interior body 30 includes a spring portion 31, a movable portion 32 continuous with one side of the spring portion 31, and a fixing portion 33 continuous with the other side of the spring portion 31, which are integrated with one another. The second developed structure 30A illustrated in FIG. 11 includes a spring-portion development 31A, a movable-portion development 32A, and a fixing-portion development 33A, which are integrated with one another. The spring-portion development 31A and a hoop of the first metal plate 12 are connected together with multiple connection ribs 41. The movable-portion development 32A and a hoop are connected together with a connection rib 42. The fixing-portion development 33A and a hoop are connected together with a connection rib 43.

The interior body 30 is formed in the following manner. A winding center line W1 is determined at a left portion, in FIG. 11, of the spring-portion development 31A illustrated in FIG. 11. A left end portion 31b of the spring-portion development 31A is deformed so as to roll the winding center line W1 at the near side in FIG. 11 in itself. While being rolled in the spring-portion development 31A, the winding center line W1 is gradually shifted rightward in FIG. 11. Thus, as illustrated in FIGS. 3B, 12A, and 12B, the spring portion 31, which is a compressed coil spring having a multiplex winding structure, is formed.

Figure 5:
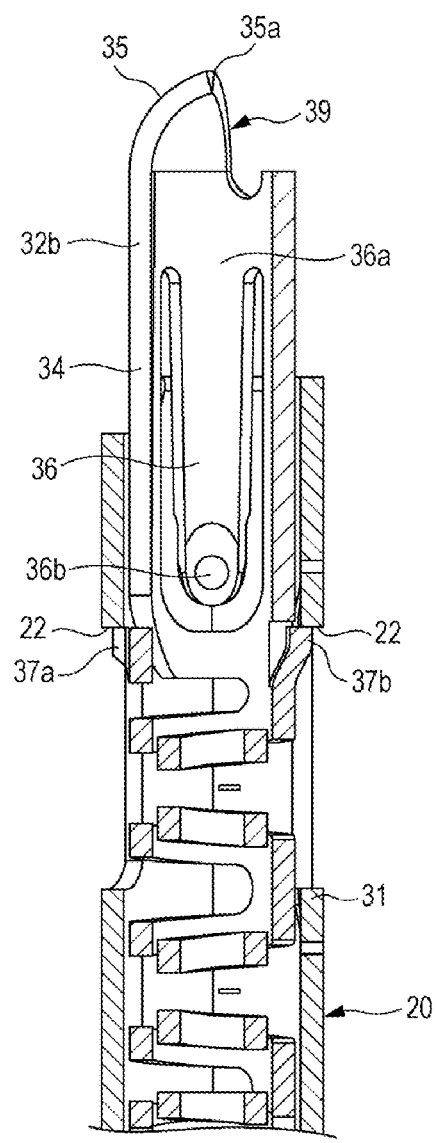
FIG. 5 is a partially enlarged sectional view of the spring contact illustrated in FIG. 2 taken along the line V-V.
Figure 12A:
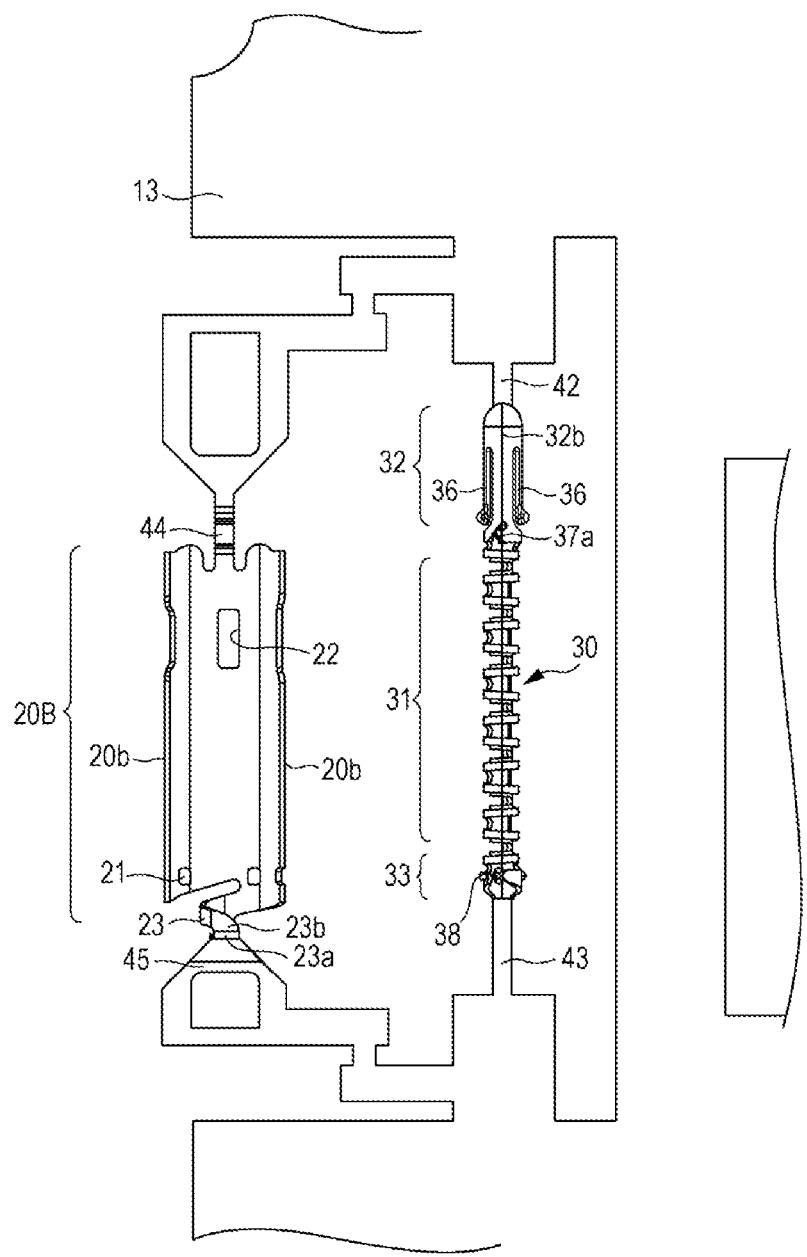
FIG. 12A illustrates a third step of the method according to the first embodiment for manufacturing the spring contact illustrated in FIG. 2.
Figure 12B:
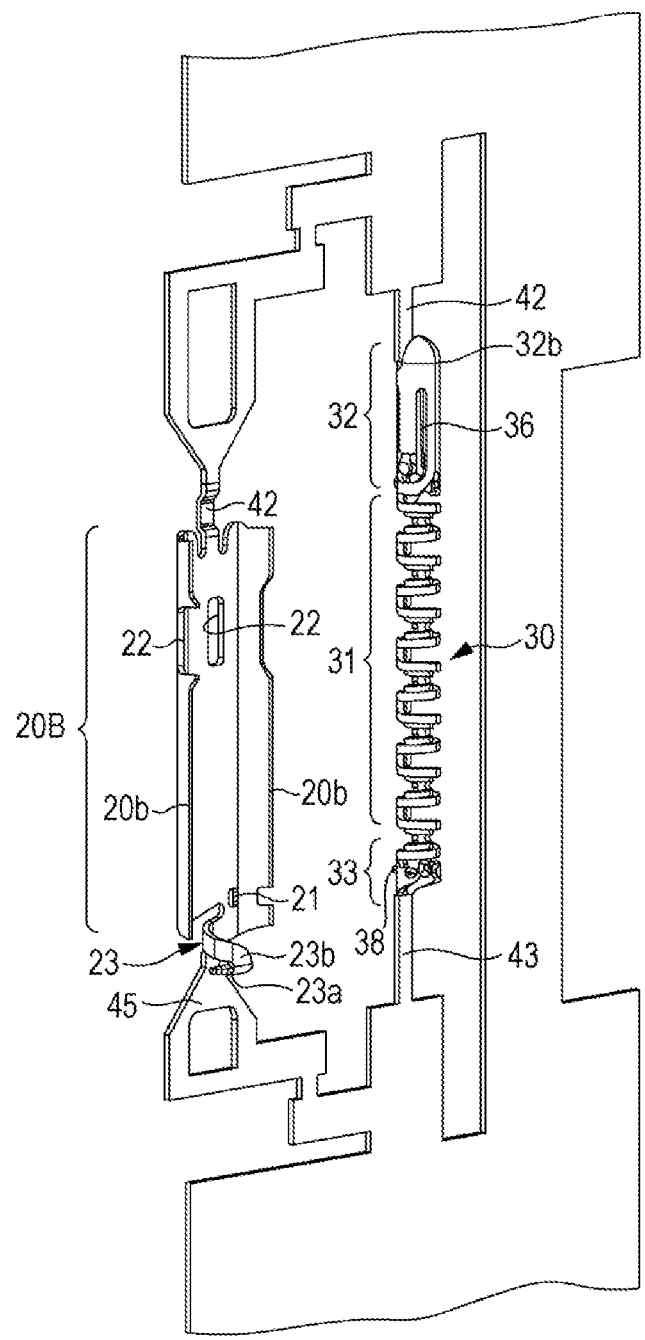
FIG. 12B is a perspective view of the third step illustrated in FIG. 12A.

In addition, both side edges 32b of the movable-portion development 32A illustrated in FIG. 11 are bent toward the near side in FIG. 11 while having the winding center line W2 at the center, so that the movable portion 32 illustrated in FIGS. 3B, 12A, and 12B is formed. A lower portion of the movable portion 32 serves as a cylindrical movable body 34 and a tip portion 35 continuous with the movable body 34 tapers so that its diameter gradually decreases toward the upper end. As illustrated in FIG. 5, the tip portion 35 has a semi-tapered shape having a recess 39 at the far side of FIG. 3B. In the movable portion 32, a tip of the tip portion 35 of the movable portion 32 or the portion adjacent the tip serves as a contact portion 35a that touches an external terminal.

As illustrated in FIG. 5, the tip portion 35 has a recess 39. The contact portion 35a is thus slightly sharp. When receiving the elastic force of the spring portion 31, the contact portion 35a is brought into contact with an external terminal with relatively high pressure. The structures of the tip portion 35 and the contact portion 35a are not limited to those according to the above embodiment. The tip portion 35 may have a tapered shape without having the recess 39 or a shaper needle shape. Alternatively, the tip of the tip portion 35 may have a flat surface, which serves as a contact portion.

Figure 6:
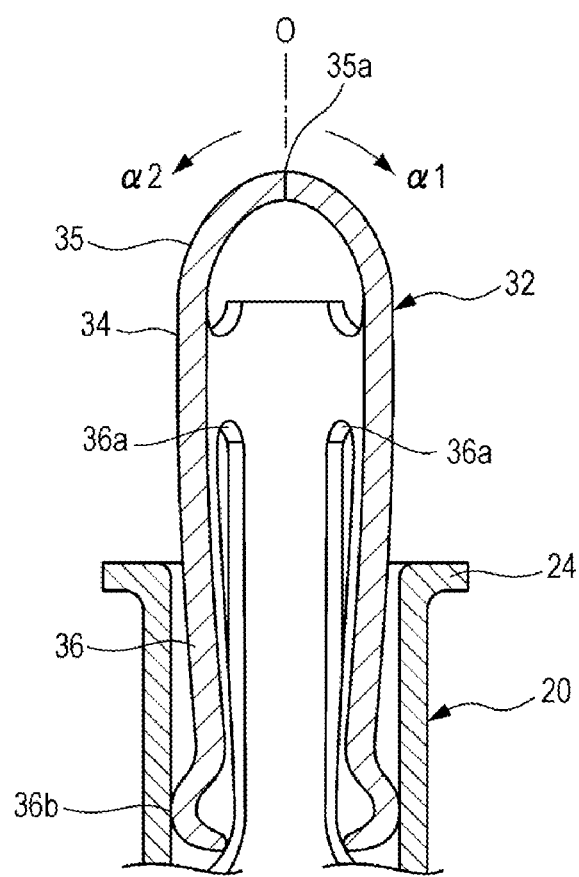
FIG. 6 is a partially enlarged sectional view of the vertical section illustrated in FIG. 4.

As illustrated in FIG. 6 in an enlarged manner, the movable body 34 of the movable portion 32 includes a pair of elastic arms 36, which are integrated together. The pair of elastic arms 36 face each other at an angular gap of 180 degrees with the center line O of the interior body 30 interposed therebetween. A connection portion 36a between the elastic arms 36 and the movable body 34 is located at an upper portion and an elastically pressing portion 36b is located at a lower free end portion. As illustrated in FIGS. 11, 12A, and 12B, while the movable portion 32 is being formed by bending the movable-portion development 32A, the second metal plate 13 forming the elastic arms 36 is subjected to blanking and the elastically pressing portion 36b is formed with pressure so as to protrude outward from the lower end of each elastic arm 36.

As illustrated in FIGS. 3A and 5, the interior body 30 includes second fasteners 37a and 37b between the spring portion 31 and the movable body 34, that is, between the spring portion 31 and the elastic arms 36. The second fastener 37a is formed by bending outward a protruding piece at a lower portion of the movable-portion development 32A illustrated in FIG. 11. The second fastener 37b is formed by cutting and erecting outward a portion at the lower center portion of the movable-portion development 32A illustrated in FIG. 11.

In the movable portion 32 of the interior body 30, a first opposing direction (lateral direction in FIG. 3B) in which the elastic arms 36 face each other and a second opposing direction (lateral direction in FIG. 5) in which the second fasteners 37a and 37b face each other are perpendicular to each other. Since the direction in which the elastic arms 36 face each other and the direction in which the second fasteners 37a and 37b face each other are perpendicular to each other, the space in the movable body 34 of the movable portion 32 can be effectively used to arrange the elastic arms 36 and the second fasteners 37a and 37b, which have different functions.

Subsequently, both side edges 33b of the fixing-portion development 33A illustrated in FIG. 11 are bent toward the near side in FIG. 11 while having a winding center line W3 at the near side. Thus, the fixing portion 33 is formed as illustrated in FIGS. 3B, 12A, and FIG. 12B. The fixing portion 33 has a shape of a cylinder from which a part is recessed. First fasteners 38, which protrude outward, are disposed at multiple portions of the fixing portion 33. In the steps illustrated in FIGS. 11, 12A, and 12B, the first fasteners 38 are formed by partially press-forming the fixing-portion development 33A and erecting part of the second metal plate 13 outward.

As illustrated in FIGS. 2 and 3A, the exterior body 20 is formed from the first metal plate 12 into a cylindrical shape. In the manufacturing method illustrated in FIG. 10 and the subsequent drawings, the first developed structure 20A illustrated in FIG. 11 is bent so that, in the steps illustrated in FIGS. 13 and 14, the exterior body 20 is formed into a cylinder shape so as to roll the interior body 30, formed by bending the second metal plate 13, in itself. In the manufacturing method illustrated in FIG. 11 and the subsequent drawings, the exterior body 20 is formed into a cylinder shape by bending both side edges 20b of the first developed structure 20A toward the near side in FIG. 11 while having the winding center line W4 at the center. In FIG. 3A, the joint line between both side edges 20b is located at the far side.

As another example of the method for manufacturing the spring contact 10 according to the present invention, the exterior body 20 and the interior body 30 may be bent in completely separate steps and the interior body 30 may be inserted into the completed exterior body 20 or a semi-cylindrical exterior body 20 to be assembled with the exterior body 20.

As illustrated in FIG. 3A, the cylindrical exterior body 20 has first fastener receivers 21, open at lower portions (closer to a base end portion), and second fastener receivers 22, open at upper portions (closer to a tip portion).

As illustrated in FIG. 3A, the fixing terminal 23 is integrated with a lower portion (base portion) of the exterior body 20. The fixing terminal 23 includes a fixed piece 23a, soldered to, for example, a conductive pattern of the board 4 illustrated in FIG. 2, and a curved portion 23b, extending from the lower portion of the tube of the exterior body 20 to the fixed piece 23a. The curved portion 23b is formed into a cylindrical helix so as to follow the external surface of the tube of the exterior body 20. The exterior body 20 may be an angular tube. In this case, the curved portion 23b is formed into a polygonal helix. Nevertheless, the curved portion 23b is preferably formed into a cylindrical helix to avoid local stress concentration on the curved portion 23b.

As illustrated in FIG. 3A, the exterior body 20 includes upper positioning protrusions 24, integrated with and bent outward from the upper open end. The exterior body 20 also includes lower positioning protrusions 25, integrated with and formed by erecting outward part of the tube of the exterior body 20, at portions slightly above the fixing terminal 23.

Figure 4:
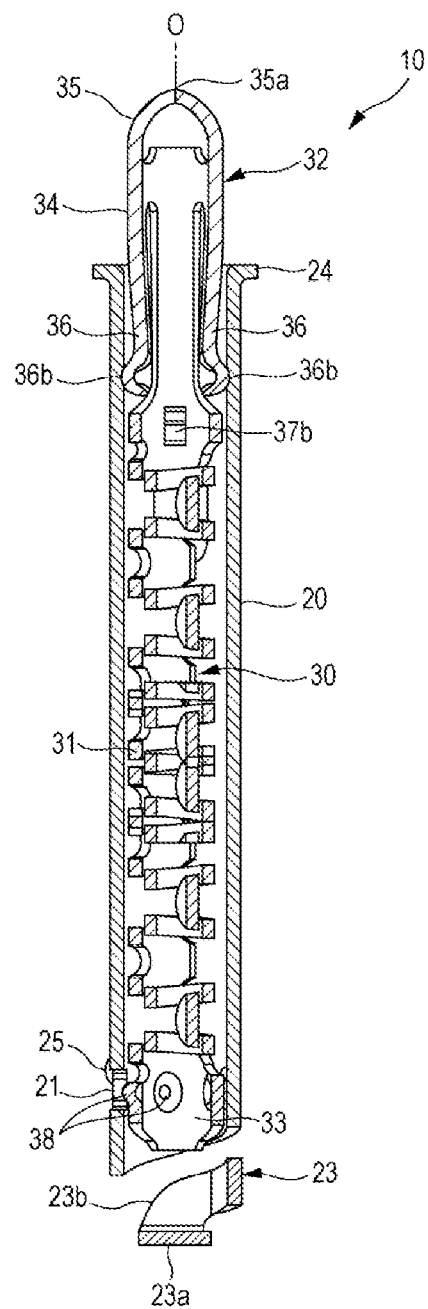
FIG. 4 is a sectional view of the spring contact illustrated in FIG. 2 taken vertically and viewed from the front.

FIGS. 4, 5, and 6 are sectional views of the structure in which the interior body 30 is housed in the exterior body 20.

As illustrated in FIG. 4, in the state where the interior body 30 is housed in the exterior body 20, the first fasteners 38 at the lower portion of the interior body 30 are fitted into the first fastener receivers 21 of the exterior body 20 so as to restrict the vertical movement of the fixing portion 33 of the interior body 30 inside the exterior body 20. At this time, the movable portion 32 of the interior body 30 protrudes upward from the upper open end of the exterior body 20. When the movable portion 32 is pushed into the exterior body 20, the pair of elastic arms 36 are bent inward so that the elastically pressing portions 36b of the elastic arms 36 are elastically pressed against the tubular internal surface of the exterior body 20. The second fasteners 37a and 37b are brought into contact with the tubular internal surface of the exterior body 20, so that the movable portion 32 moves into the exterior body 20 while gradually reducing its diameter. When the movable portion 32 is pushed in up to the position illustrated in FIG. 5, the second fasteners 37a and 37b are fastened to the second fastener receivers 22 of the exterior body 20, so that the spring contact 10 is complete.

In the spring contact 10 assembled into the state illustrated in FIGS. 4 and 5, the first fasteners 38 and the second fasteners 37a and 37b are fastened to the exterior body 20 while the spring portion (compression coil spring) 31 of the interior body 30 is vertically contracted. Thus, the interior body 30 is prevented from easily coming off from the exterior body 20.

The movable portion 32 of the interior body 30 is constantly urged by the elastic restoring force of the spring portion 31 in such a direction as to protrude outward from the upper end opening of the exterior body 20. In this state, the movable portion 32 can move downward within a range of a vertical opening length L of the second fastener receivers 22 in the exterior body 20. During this movement, the elastically pressing portion 36b of each elastic arm 36 slides over the tubular internal surface of the exterior body 20 while being elastically pressed against the internal surface, so that the movable portion 32 and the exterior body 20 can keep electrical connection with each other.

In the embodiment, the first fasteners 38 formed in the fixing portion 33 of the interior body 30 are fitted into the first fastener receivers 21 of the exterior body 20 when the exterior body 20 and the interior body 30 are to be assembled together. Instead of providing the first fasteners 38, part of the fixing portion 33 and the exterior body 20 may be partially fixed together by, for example, laser spot welding.

In the manufacturing method according to the first embodiment illustrated in FIG. 10 and the subsequent drawings, the first metal plate 12 and the second metal plate 13 are blanked out from partially surface-joint flat plates and bent. Here, instead of a fastening structure including the first fastener receivers 21 and the first fasteners 38 illustrated in FIG. 4, a surface-joint portion between the first metal plate 12 and the second metal plate 13 may be left, so that the interior body 30 and the exterior body 20 can keep being partially connected together.

Figure 20:
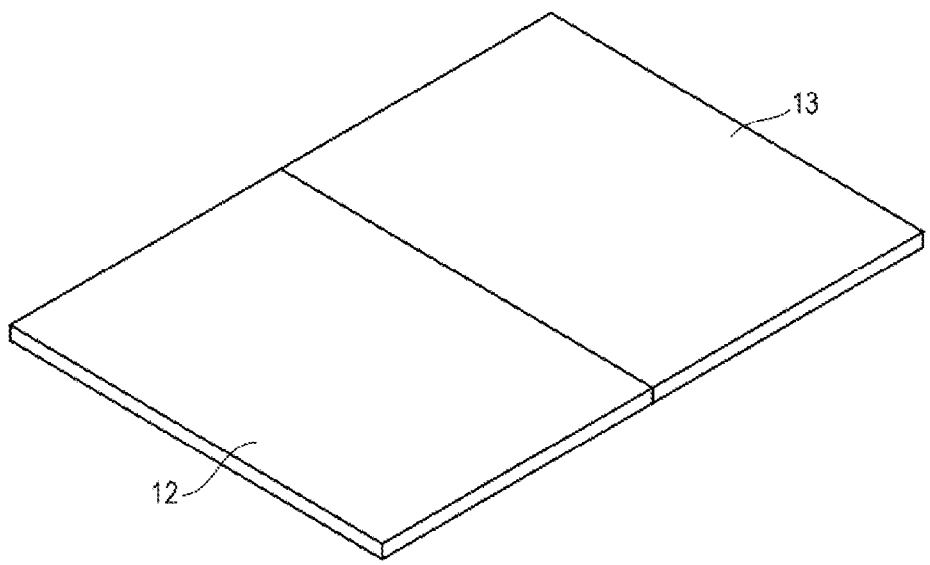
FIG. 20 is a perspective view of an edge-lay clad material used in a method according to a third embodiment for manufacturing the spring contact illustrated in FIG. 2.

In the manufacturing method according to the third embodiment illustrated in FIG. 20, the first metal plate 12 and the second metal plate 13 are blanked out from an edge-lay clad material, which is a material obtained by joining edge surfaces of plates, and bent. Here, instead of providing a fastening structure including the first fastener receivers 21 and the first fasteners 38 illustrated in FIG. 4, a junction between the edge surfaces of the first metal plate 12 and the second metal plate 13 may be left, so that the interior body 30 and the exterior body 20 can keep being partially connected together.

Functions of Spring Contact 10

In the embodiment illustrated in FIGS. 1 and 2, the exterior body 20 of the spring contact 10 is held in any of the contact holding spaces 3 of the insulating casing 2 forming the socket 1. At this time, the vertical position of the exterior body 20 inside the casing 2 can be fixed by using the upper positioning protrusions 24. In addition, the exterior body 20 of the spring contact 10 can be inserted with pressure into the contact holding space 3 using the lower positioning protrusions 25.

When high-frequency electric signals are to flow through the spring contact 10, preferably, the inner peripheral surface of the contact holding spaces 3 is plated with a material such as gold to form a conductive layer so that the conductive layer, used as a ground potential, exerts a shielding function.

In the embodiment illustrated in FIG. 2, the fixed piece 23a of the fixing terminal 23 is fixed to the conductive pattern on the surface of the board 4 using the solder joint 5. The fixing terminal 23 includes a helically curved portion 23b and a fixed piece 23a below the curved portion 23b. This configuration increases the creeping distance from the fixed piece 23a to the lower end of the tube of the exterior body 20. This configuration can render it less likely that the solder joint flux or a molten solder rises from the fixed piece 23a to the internal space of the exterior body 20 using its surface tension. This configuration is thus more likely to prevent the solder joint flux or molten solder from adhering to the spring portion 31 that operates inside the exterior body 20.

The fixing terminal 23 includes the helically curved portion 23b. Thus, even when the spring contact 10 tilts slightly while the fixed piece 23a is fixed to the board 4 with the solder joint 5 interposed therebetween, elastic or plastic deformation of the helically curved portion 23b prevents an excessive release force from being exerted on the solder-joint portion of the fixed piece 23a. Thus, the fixed piece 23a can be stably fixed with solder.

Specifically, as illustrated in FIG. 1, the socket 1 holds multiple spring contacts 10. The degree of parallelization among the multiple spring contacts 10 thus inevitably varies. If the degree of parallelization varies, any of the spring contacts 10 tilts when the multiple fixed pieces 23a are soldered to the board 4. This tilt allows a large release force to exert on the solder-joint portion of the relevant fixed piece 23a. To address this, the curved portion 23b is provided, so that the multiple spring contacts 10 can be stably fixed with solder on the surface of the board 4.

An external terminal of an electronic component such as LSI or an external terminal of a connector is pressed against the contact portion 35a of the movable portion 32 of each spring contact 10. When the contact portion 35a receives a pressing force, the spring portion 31 of the interior body 30 contracts and the movable portion 32 is pushed into the exterior body 20 within a range of the opening length L of the second fastener receivers 22 of the exterior body 20.

While being pushed in, the elastically pressing portion 36b at the lower end portion of each elastic arm 36 of the movable portion 32 slides over the internal surface of the exterior body 20 while being elastically pressed against the internal surface, so that electrical contact resistance between the movable portion 32 and the exterior body 20 decreases and electric signals flow through the path from the movable portion 32 to the fixing terminal 23 via the exterior body 20. This configuration hinders electric signals from flowing through the spring portion 31. This configuration can thus reduce the resistance of the spring contact 10, the inductance, and the impedance.

In the spring contact 10 of an embodiment, the interior body 30 is formed from the second metal plate 13 having a high modulus of elasticity and the exterior body 20 is formed from the first metal plate 12 having low resistance. Thus, the spring portion 31 can keep its spring constant and its stiffness high and the contact portion 35a of the movable portion 32 can keep its contact pressure with an external terminal high. Thus, the spring portion 31 can have long life against repeated use. In addition, the exterior body 20 and the fixing terminal 23 located below and integrated with the exterior body 20 have low electric resistance. This configuration achieves a low-resistant current passage.

As illustrated in FIG. 6 in an enlarged manner, the movable body 34 of the movable portion 32 of the interior body 30 includes the elastic arms 36 extending downward. Thus, the elastic arms 36 can have a long length fully utilizing the vertical length of the movable body 34. The elastic arms 36 face each other at an angle of 180 degrees with respect to the center line O of the interior body 30. Even when the movable portion 32 touching an external terminal tilts in any direction (for example, in α1 direction) so that the elastic arm 36 on the α2 side has lower contact pressure, the elastic arm 36 on the α1 side has higher contact pressure. The two elastic arms 36 thus supplement each other. The contact resistance between the movable portion 32 and the exterior body 20 is thus prevented from varying.

The elastic arms 36 are long and extend downward. Thus, even when the pressing force exerted on each movable portion 32 varies among the multiple spring contacts 10 and thus the degree by which the movable portion 32 is pushed into the exterior body 20 varies thereamong, the movable portions 32 can relatively freely tilt regardless of their positions. This tilting can reliably keep each elastically pressing portion 36b in contact with the internal surface of the corresponding exterior body 20.

The elastic arms 36 may be formed at three or more portions around the movable portion 32. In any case, the elastic arms 36 are preferably arranged at a uniform angle with respect to the center line O.

Method According to First Embodiment for Manufacturing Spring Contact 10

FIGS. 10 to 15 illustrate steps of a method, according to a first embodiment, for manufacturing the spring contact 10.

In a first step illustrated in FIG. 10, the first metal plate 12 is joined onto part of the second metal plate 13 with their flat surfaces facing each other. In FIG. 10, the reference numeral 12f denotes a hoop that moves the first metal plate 12 to the position at which it overlaps the second metal plate 13.

An upper edge 12a of the first metal plate 12, in FIG. 10, is superposed on a connection piece 13a of the second metal plate 13. The connection piece 13a and the first metal plate 12 are fixed together by laser spot welding or chalking to form a connection portion 15a. A lower edge 12b of the first metal plate 12, in FIG. 10, is superposed on a connection piece 13b of the second metal plate 13. The connection piece 13b and the first metal plate 12 are fixed together by laser spot welding or chalking to form a connection portion 15b. Except for the overlap width with the first metal plate 12, the second metal plate 13 is absent between the connection piece 13a and the connection piece 13b.

In a second step illustrated in FIG. 11, the first metal plate 12 is subjected to blanking to cut out the first developed structure 20A, forming the exterior body 20, and the second metal plate 13 is subjected to blanking to cut out the second developed structure 30A, forming the interior body 30.

The first developed structure 20A has an upper portion illustrated in FIG. 11 continuous with a connection rib 44, which is part of the first metal plate 12, and a lower portion illustrated in FIG. 11 continuous with a connection rib 45, which is part of the first metal plate 12.

As described above, in the second developed structure 30A, the spring-portion development 31A is connected to the multiple connection ribs 41. The movable-portion development 32A is connected to the connection rib 42 and the fixing-portion development 33A is connected to the connection rib 43. The connection ribs 41, 42, and 43 are part of the second metal plate 13.

In a third step illustrated in FIGS. 12A and 12B, the second developed structure 30A illustrated in FIG. 11 is bent to form the interior body 30. As described above, the spring-portion development 31A illustrated in FIG. 11 is rolled to form the spring portion 31. Before or after this rolling step, the spring-portion development 31A and the connection ribs 41 are cut off along the cutting-plane line C1 in FIG. 11.

Concurrently or before or after rolling of the spring portion 31, the movable-portion development 32A illustrated in FIG. 11 is bent to form the movable portion 32 and the fixing-portion development 33A illustrated in FIG. 11 is bent to form the fixing portion 33.

In the third step illustrated in FIGS. 12A and 12B, left and right side portions of the first developed structure 20A are slightly bent to form an exterior body workpiece 20B. In addition, a lower end portion of the first developed structure 20A, illustrated in the drawing, is bent to form the fixing terminal 23 having the fixed piece 23a and the helically curved portion 23b.

Figure 13:
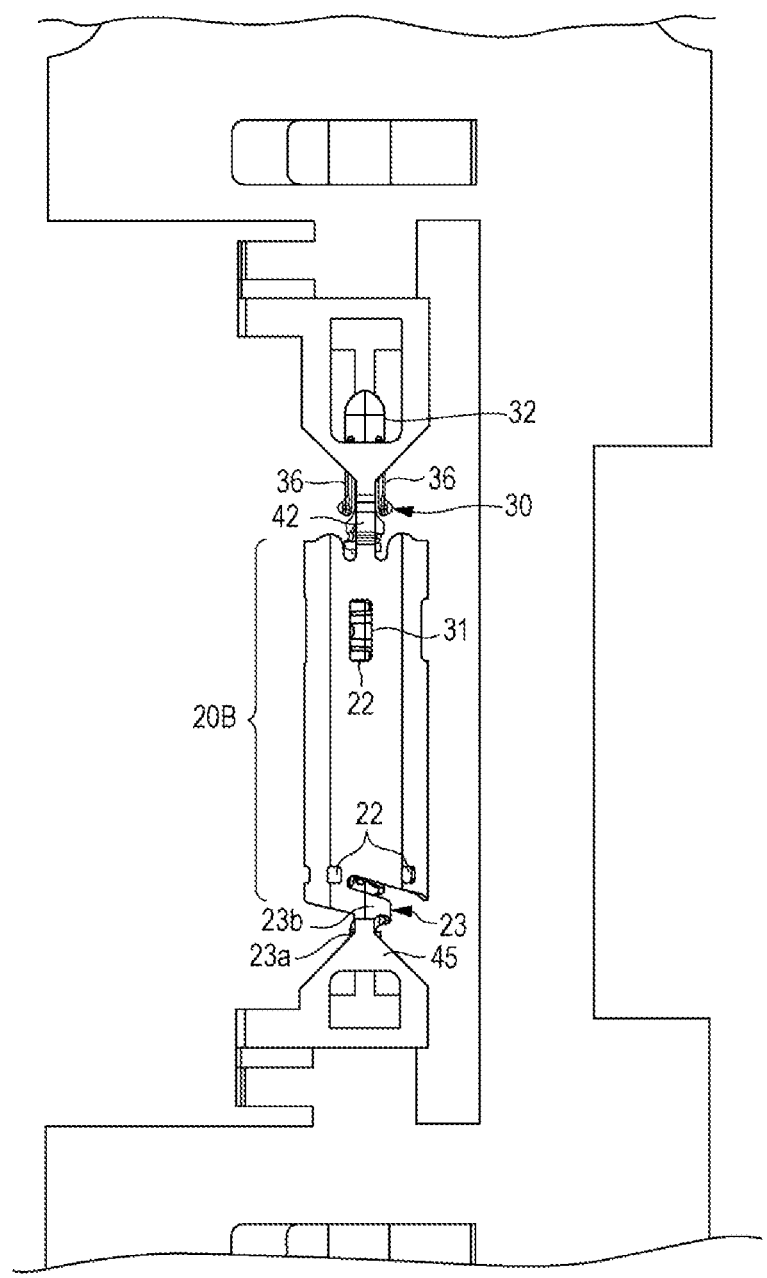
FIG. 13 illustrates a fourth step of the method according to the first embodiment for manufacturing the spring contact illustrated in FIG. 2.

In a fourth step illustrated in FIG. 13, part of the second metal plate 13 connecting the first developed structure 20A and the second developed structure 30A together is bent and the exterior body workpiece 20B is bent back to be superposed on the bent interior body 30. In a fifth step illustrated in FIG. 14, the workpiece 20B is further bent into a cylindrical shape so that both side edges 20b are joined together while touching each other. Thus, the cylindrical exterior body 20 is complete.

Figure 14:
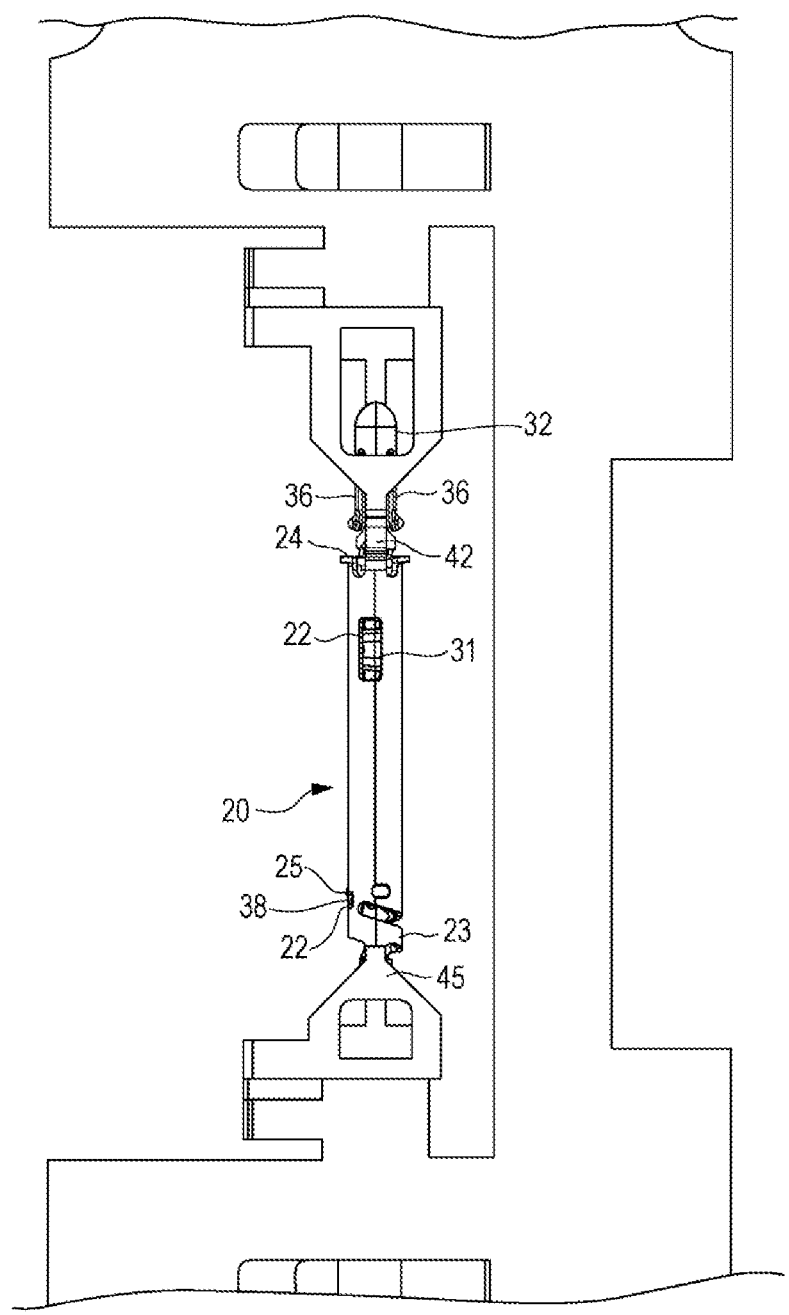
FIG. 14 illustrates a fifth step of the method according to the first embodiment for manufacturing the spring contact illustrated in FIG. 2.

When the exterior body 20 is bent into a cylindrical shape as illustrated in FIG. 14, the interior body 30 is housed in the exterior body 20. At this time, the first fasteners 38 of the fixing portion 33 at the lower portions of the interior body 30 enter the first fastener receivers 21 of the exterior body 20, so that the fixing portion 33 of the interior body 30 is held inside the exterior body 20 so as not to move vertically.

Figure 15:
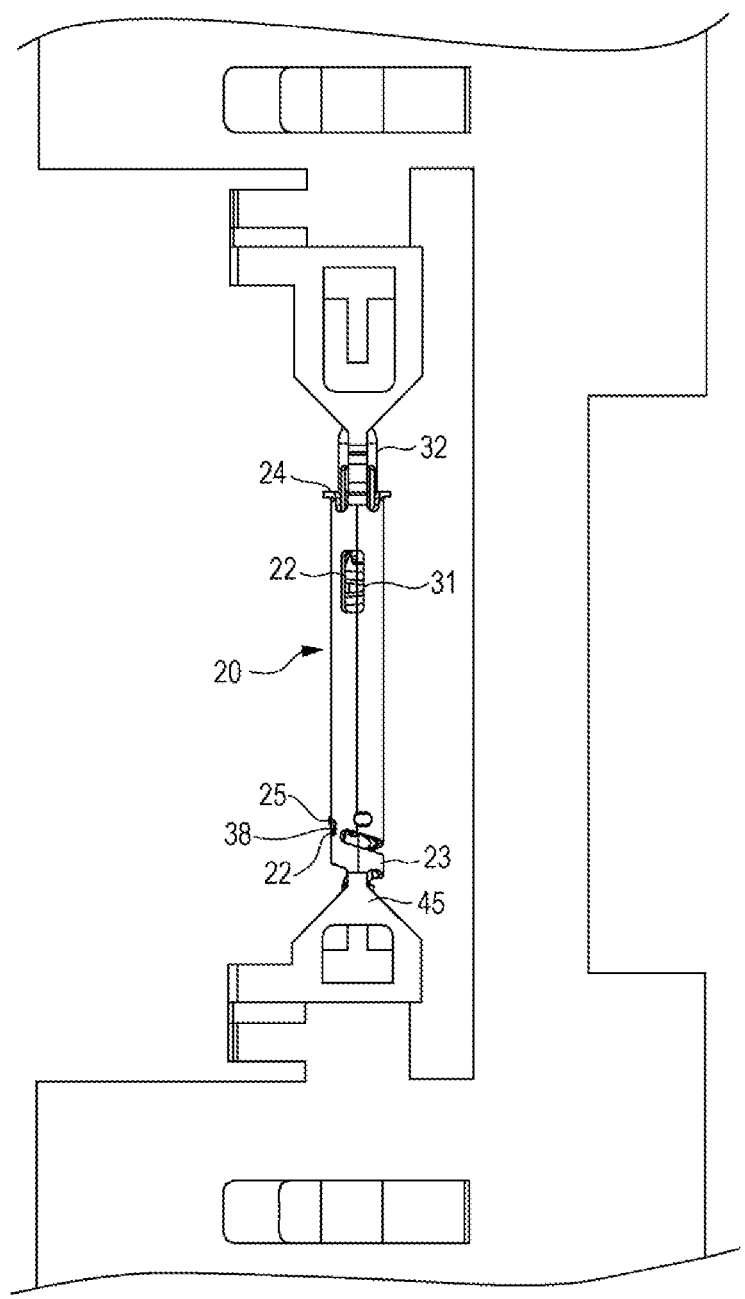
FIG. 15 illustrates a sixth step of the method according to the first embodiment for manufacturing the spring contact illustrated in FIG. 2.

In a sixth step illustrated in FIG. 15, the shaped movable portion 32 and the connection rib 42 are detached from each other along the cutting-plane line C2 illustrated in FIG. 11. Then, the movable portion 32 is pushed into the tube of the exterior body 20 and the second fasteners 37a and 37b of the movable portion 32 are fastened to the second fastener receivers 22 of the exterior body 20.

Thereafter, the fixing portion 33 of the interior body 30 and the connection rib 43 are detached from each other along the cutting-plane line C3 illustrated in FIG. 11. In addition, the first metal plate 12 is cut along the cutting-plane lines C4 and C5 illustrated in FIG. 11 to take out the complete spring contact 10.

In the manufacturing method according to the first embodiment illustrated in FIGS. 10 to 15, while the first metal plate 12 and the second metal plate 13 are joined together, the first developed structure 20A and the second developed structure 30A are blanked out and then bent so that the exterior body 20 and the interior body 30 are assembled together. Thus, the interior body 30 and the exterior body 20 can be assembled with high accuracy and the operation of assembling the interior body 30 and the exterior body 20 together can be automated.

While the spring contact 10 is processed in the manufacturing method according to the first embodiment, the junction between the flat surfaces of the first metal plate 12 and the second metal plate 13 may be left instead of providing the fastening structure including the first fastener receivers 21 and the first fasteners 38 illustrated in FIG. 4. Leaving the junction can keep the interior body 30 and the exterior body 20 being partially connected together.

Method According to Second Embodiment for Manufacturing Spring Contact 10

FIGS. 16 to 19 illustrate steps of a method according to a second embodiment for manufacturing the spring contact 10.

Figure 16A:
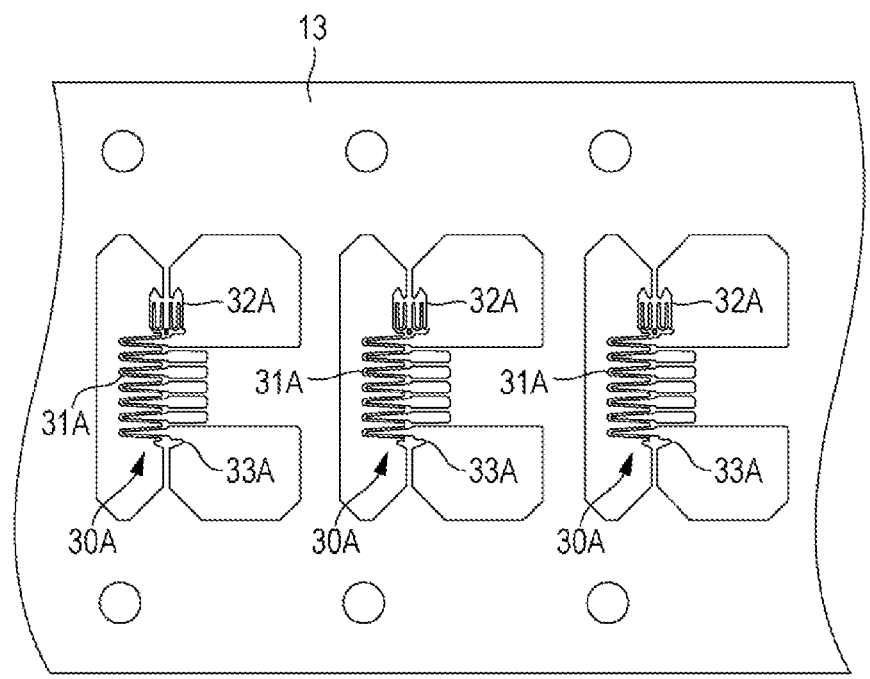
FIGS. 16A and 16B illustrate a first step of a method according to a second embodiment for manufacturing the spring contact illustrated in FIG. 2.
Figure 16B:
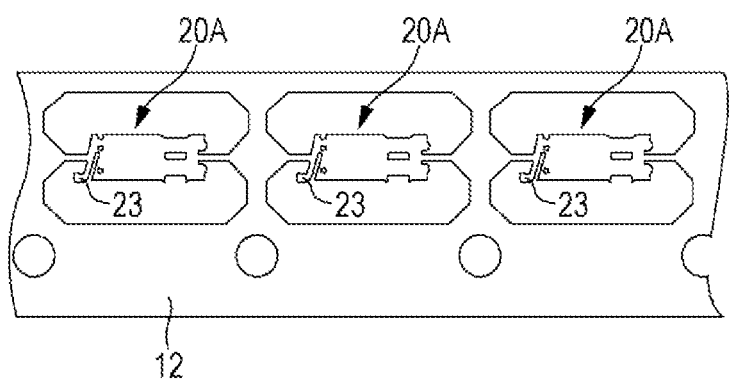

In a first step, first developed structures 20A are blanked out from the second metal plate 13, as illustrated in FIG. 16A, and second developed structures 30A are blanked out from the first metal plate 12, as illustrated in FIG. 16B. Each first developed structure 20A and each second developed structure 30A have the same shapes as those illustrated in FIG. 11.

Figure 17A:
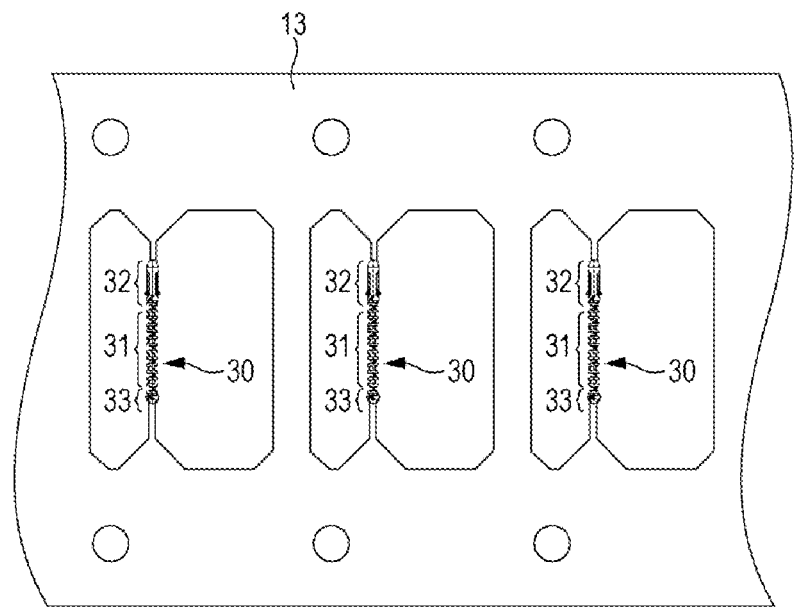
FIGS. 17A and 17B illustrate a second step of the method according to the second embodiment for manufacturing the spring contact illustrated in FIG. 2.
Figure 17B:
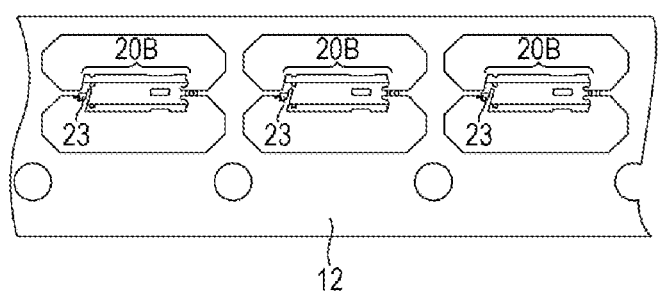

In a second step, as illustrated in FIG. 17A, the second developed structure 30A of the second metal plate 13 is bent to form the interior body 30. As illustrated in FIG. 17B, both side portions of the first developed structure 20A of the first metal plate 12 are processed to form the exterior body workpiece 20B. Concurrently, the fixing terminal 23 of the exterior body 20 is bent. The shape of the workpiece 20B is the same as that illustrated in FIGS. 12A and 12B.

Figure 18:
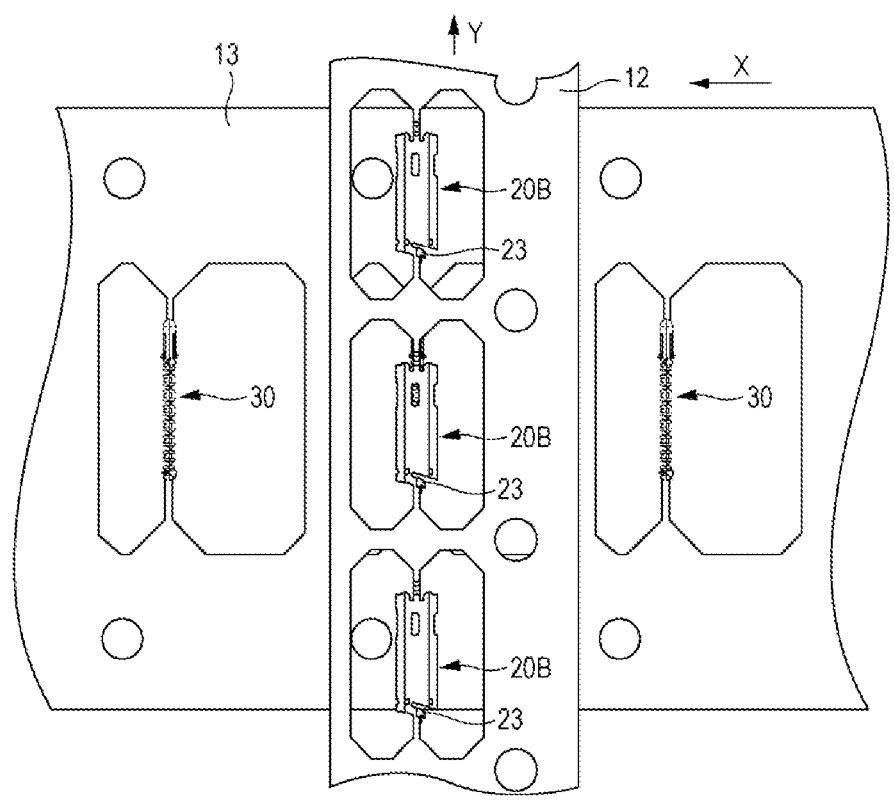
FIG. 18 illustrates a third step of the method according to the second embodiment for manufacturing the spring contact illustrated in FIG. 2.
Figure 19:
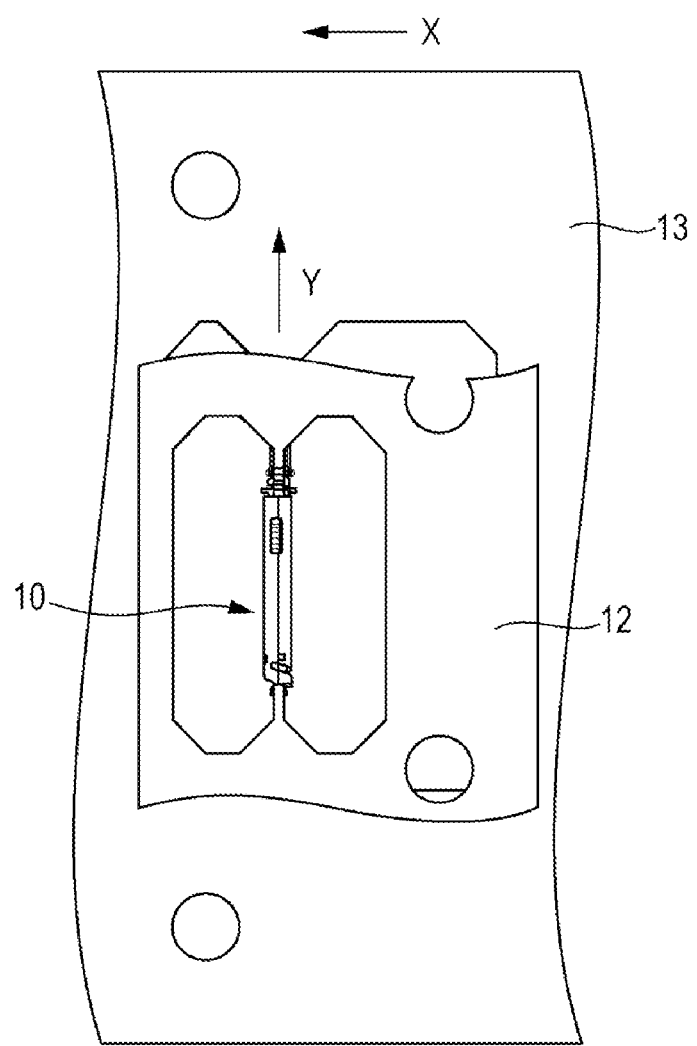
FIG. 19 illustrates a fourth step of the method according to the second embodiment for manufacturing the spring contact illustrated in FIG. 2.

In a third step illustrated in FIG. 18, the first metal plate 12 illustrated in FIG. 17B is turned over and superposed on the second metal plate 13 and the exterior body workpiece 20B is superposed on the interior body 30. In a fourth step illustrated in FIG. 19, the workpiece 20B is bent into a cylinder shape so as to wrap the interior body 30 to form the exterior body 20.

In the third and fourth steps, the second metal plate 13 is transmitted section by section in the X direction and the first metal plate 12 is transmitted section by section in the Y direction so that the interior body 30 and the workpiece 20B are sequentially assembled together.

Method According to Third Embodiment for Manufacturing Spring Contact 10

In the manufacturing method according to the first embodiment, as illustrated in FIG. 10, the first metal plate 12 is superposed on the second metal plate 13. The first metal plate 12 and the second metal plate 13 are disposed so as to partially face each other, partially joined together by welding or chalking, and then shifted to blanking and bending operations. Instead, in the manufacturing method according to a third embodiment, an edge-lay clad material illustrated in FIG. 20 is used.

An edge-lay clad material is a metal plate in which the first metal plate 12 and the second metal plate 13 made from different metals are joined together at their edge surfaces. From this edge-lay clad material, the first developed structure 20A and the second developed structure 30A are blanked out, as illustrated in FIG. 11, and then bent into the exterior body 20 and the interior body 30. At this time, instead of providing the fastening structure including the first fastener receivers 21 and the first fasteners 38 illustrated in FIG. 4, a junction between the edge surfaces of the first metal plate 12 and the second metal plate 13 may be left so that the interior body 30 and the exterior body 20 can be kept being partially connected together.

Modifications

FIGS. 7A to 7C illustrate modifications of the spring contact 10 according to the first embodiment.

In the modification illustrated in FIG. 7A, the movable body 34 of the movable portion 32 of the interior body 30 includes elastic arms 36 extending upward. Each elastic arm 36 has a connection portion 36a at a lower portion and an elastically pressing portion 36b at an upper portion. In the modification illustrated in FIG. 7B, the exterior body 20 includes elastic arms 136. Each elastic arm 136 extends upward and has a connection portion 136a at a lower portion and an elastically pressing portion 136b at an upper portion. In the modification illustrated in FIG. 7C, the exterior body 20 includes elastic arms 136 extending downward. Each elastic arm 136 has a connection portion 136a at an upper portion and an elastically pressing portion 136b at a lower portion. In each of the configurations in FIGS. 7B and 7C, the elastically pressing portion 136b is elastically pressed against the external surface of the movable body 34 of the movable portion 32.

The elastic arms 36 or 136 may have any form. Preferably, the elastic arms are included in the interior body 30 since the interior body 30 has a structure having a higher modulus of elasticity than the exterior body 20.

When the elastic arms are to be disposed on the movable portion, the movable portion may have a larger thickness than the exterior body. When the elastic arms are to be disposed on the exterior body, the exterior body may have a larger thickness than the elastic arms.

In order to maximize the length of the elastic arms 36 within the limited dimensions of the movable portions 32 and maximize the vertical stroke of the movable portions 32, preferably, the elastic arms 36 extend in the movement direction of the movable portions 32 and the elastically pressing portions 36b protrude downward, as illustrated in the first embodiment illustrated in FIG. 6.

In the present invention, the interior body 30 and the exterior body 20 may be integrally and continuously formed from the same metal plate.

Spring Contact 101 According to Second Embodiment

Figure 8:
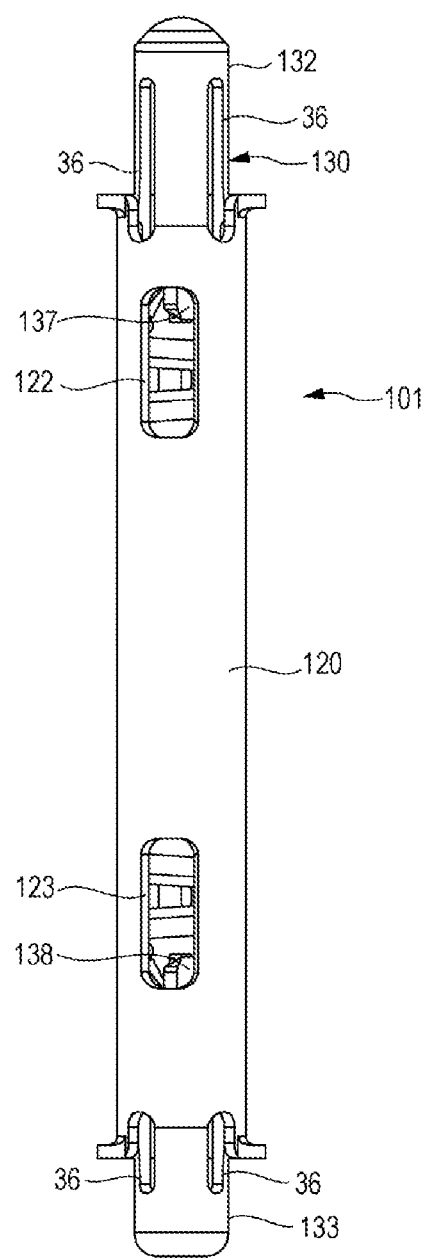
FIG. 8 is a front view of the exterior of a spring contact according to a second embodiment of the present invention.
Figure 9A:
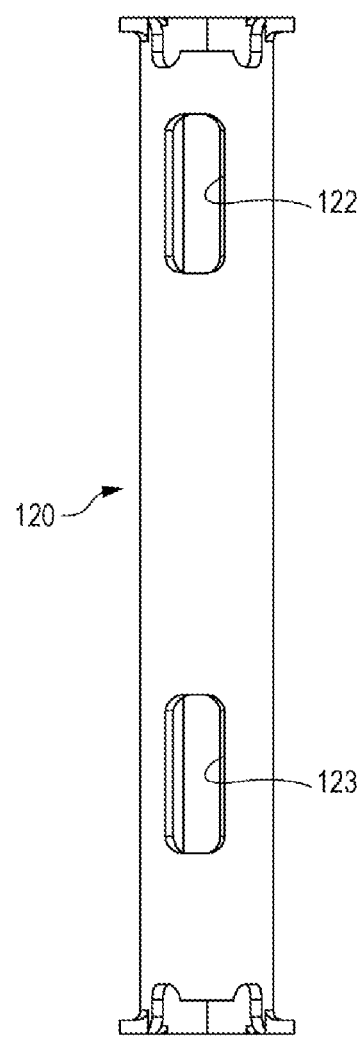
FIG. 9A is a front view of an exterior body of the spring contact illustrated in FIG. 8.
Figure 9B:
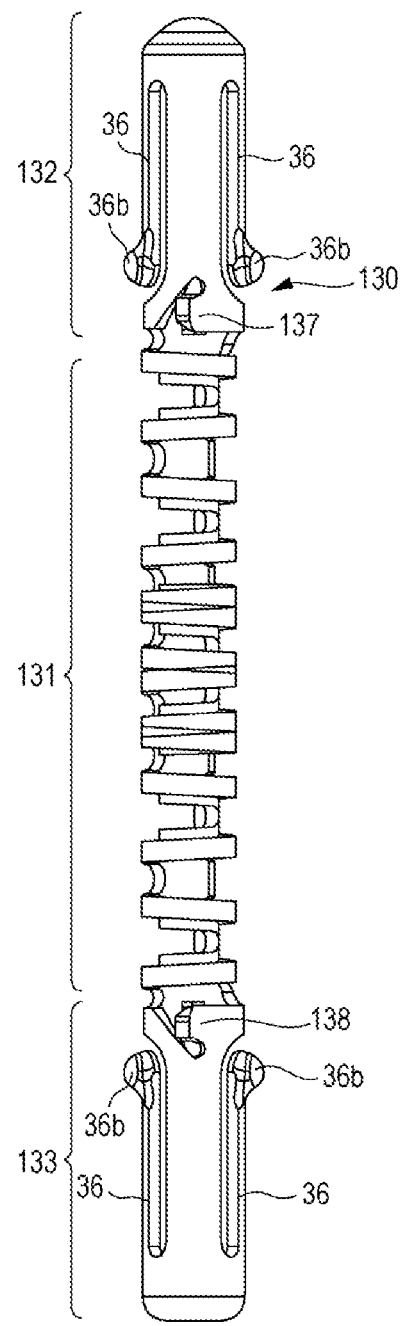
FIG. 9B is a front view of an interior body of the spring contact illustrated in FIG. 8.

FIG. 8 illustrates a spring contact 101 according to a second embodiment of the present invention. FIG. 9A illustrates an exterior body 120 and FIG. 9B illustrates an interior body 130. The exterior body 120 is formed from the first metal plate 12 and the interior body 130 is formed from the second metal plate 13.

As illustrated in FIG. 9B, the interior body 130 includes a spring portion 131, a first movable portion 132, continuous with one side of the spring portion 131, and a second movable portion 133, continuous with the other side of the spring portion 131. The first movable portion 132 includes elastic arms 36 and a fastener 137. The second movable portion 133 includes elastic arms 36 and a fastener 138.

In the same manner as in the steps in the manufacturing method according to the first or second embodiment, the first metal plate 12 and the second metal plate 13 are bent to form the exterior body 120 and the interior body 130 and the exterior body 120 and the interior body 130 are assembled together.

After the completion of assembly, the fastener 137 of the first movable portion 132 is fastened to a fastener receiver 122 of the exterior body 120 and the fastener 138 of the second movable portion 133 is fastened to a fastener receiver 123 of the exterior body 120. At this time, the spring portion 131 contracts. Thus, the first movable portion 132 and the second movable portion 133 are urged so as to vertically protrude from the exterior body 120.

The elastically pressing portion 36b of each elastic arm 36 of the first movable portion 132 and the elastically pressing portion 36b of each elastic arm 36 of the second movable portion 133 are elastically pressed against the internal surface of the exterior body 120. Thus, the first movable portion 132 and the second movable portion 133 are electrically connected to each other through the exterior body 120.

As illustrated in FIG. 8, in the spring contact 101 according to the second embodiment, the first movable portion 132 and the second movable portion 133 protrude from both end openings of the exterior body 120. The contact portion of the first movable portion 132 and the contact portion of the second movable portion 133 are elastically pressed against the conductive pattern of the board or an external terminal.

What is claimed is:

1. A spring contact, comprising:
   an exterior body made of a first metal; and
   an interior body housed in the exterior body and made of a second metal, the interior body including a spring portion, a movable portion continuous with at least one side of the spring portion, and a contact portion that is part of the movable portion, the movable portion being urged by an elastic force of the spring portion in such a direction as to protrude from the exterior body,
   wherein at least one elastic arm is formed integrally with the movable portion and the at least one elastic arm extends along an internal surface of the exterior body and includes, at a free end of the at least one elastic arm, an elastically pressing portion that protrudes toward the exterior body, wherein the elastically pressing portion is elastically pressed against an internal surface of the exterior body such that the movable portion is slidable over the internal surface of the exterior body.

2. A spring contact, comprising:
   an exterior body made of a first metal; and
   an interior body housed in the exterior body and made of a second metal, the interior body including a spring portion, a movable portion continuous with at least one side of the spring portion, and a contact portion that is part of the movable portion, the movable portion being urged by an elastic force of the spring portion in such a direction as to protrude from the exterior body,
   wherein at least one elastic arm is formed integrally with the exterior body and part of the at least one elastic arm is elastically pressed against an external surface of the movable portion.

3. The spring contact according to claim 2, wherein the at least one elastic arm is formed integrally with the movable portion and part of the at least one elastic arm is elastically pressed against the internal surface of the exterior body so as to be slidable over the internal surface.

4. The spring contact according to claim 1, wherein the interior body comprises a material having a higher modulus of elasticity than a material of the exterior body.

5. The spring contact according to claim 4, wherein the interior body comprises a metal material having a higher Young's modulus than a metal material of the exterior body.

6. The spring contact according to claim 1, wherein the interior body and the exterior body comprise metal plates and the metal plate of the interior body or the exterior body that includes the at least one elastic arm is thicker than the other metal plate.

7. The spring contact according to claim 1, wherein the at least one elastic arm extends downward in a direction in which the movable body is housed in the exterior body.

8. The spring contact according to claim 1, wherein the at least one elastic arm includes a plurality of elastic arms arranged at a plurality of portions around a center line extending in a direction in which the movable body moves.

9. The spring contact according to claim 8, wherein the plurality of elastic arms are arranged at equal angular intervals around the center line.

10. The spring contact according to claim 8, wherein the plurality of elastic arms are arranged at an angle of 180 degrees with a center line along which the movable portion moves interposed therebetween.

11. The spring contact according to claim 10, further comprising fastening portions facing in a second opposing direction, crossing a first opposing direction in which the elastic arms face each other, the fastening structure fastening the movable body and the exterior body with each other.

12. The spring contact according to claim 1, wherein the contact portion protrudes from a first end portion of the exterior body, a fixing terminal is integrally formed with a second end portion of the exterior body, and the fixing terminal includes a curved portion.

13. The spring contact according to claim 1, wherein the interior body includes the movable portion on each of two sides of the spring portion and the at least one elastic arm is disposed between each movable portion and the exterior body.

14. A socket comprising an insulating casing,
   wherein the casing has a holding space that holds the exterior body of the spring contact according to claim 1.

15. The socket according to claim 14, wherein the exterior body includes a positioning protrusion which is positioned on the casing.

* * * * *